(12) United States Patent
Jackson et al.

(10) Patent No.: US 6,941,330 B2
(45) Date of Patent: Sep. 6, 2005

(54) FEED FORWARD SIGMA DELTA INTERPOLATOR FOR USE IN A FRACTIONAL-N SYNTHESIZER

(75) Inventors: Thomas Jackson, Frederick, MD (US); George Eapen, Germantown, MD (US); Foster Dai, Germantown, MD (US)

(73) Assignee: Hughes Electronics Corporation, El Segundo, CA (US)

( * ) Notice: Subject to any disclaimer, the term of this patent is extended or adjusted under 35 U.S.C. 154(b) by 688 days.

(21) Appl. No.: 09/963,350

(22) Filed: Sep. 26, 2001

(65) Prior Publication Data

US 2002/0036544 A1 Mar. 28, 2002

Related U.S. Application Data

(60) Provisional application No. 60/235,685, filed on Sep. 27, 2000.

(51) Int. Cl.[7] .................................................. G06F 1/02
(52) U.S. Cl. ....................................................... 708/270
(58) Field of Search ................................ 708/270, 274, 708/271, 290, 277

(56) References Cited

U.S. PATENT DOCUMENTS

| | | | | |
|---|---|---|---|---|
| 4,270,026 A | * | 5/1981 | Shenoi et al. | 708/290 |
| 4,302,631 A | * | 11/1981 | Shenoi et al. | 708/313 |
| 5,079,521 A | * | 1/1992 | Gaskell et al. | 331/1 A |
| 5,563,535 A | * | 10/1996 | Corry et al. | 327/105 |
| 5,786,778 A | * | 7/1998 | Adams et al. | 708/313 |
| 5,920,233 A | * | 7/1999 | Denny | 331/14 |
| 6,642,754 B1 | * | 11/2003 | Dobramysl et al. | 708/271 |
| 6,707,855 B2 | * | 3/2004 | Patana | 375/244 |

FOREIGN PATENT DOCUMENTS

| | | |
|---|---|---|
| EP | 0 429 217 A2 | 7/1990 |
| EP | 0 438 867 A2 | 11/1990 |
| EP | 0 788 237 A1 | 6/1997 |

OTHER PUBLICATIONS

Mücahit Kozak, Izzet Kale, Assaad Borjak, and Taoufik Bourdi, "A Pipelined All–Digital Delta–Sigma Modulator For Fractional–N Frequency Synthesis", University of Westminster, Department of Electronic Systems, Applied DSP and VLSI Research Group, London, W1M 8JS, England, UK and Nokia Networks, Camberly, Surrey GU15 3BW, England, UK, XP–002210566, 2000, pp. 1153–1557.

* cited by examiner

Primary Examiner—Todd Ingberg
Assistant Examiner—Chat C. Do
(74) Attorney, Agent, or Firm—Craig Plastrik

(57) ABSTRACT

A sigma delta interpolator for use in a fractional N synthesizer having a multi-modulus divider for controlling the output frequency of the synthesizer. The sigma delta interpolator includes an accumulator operative for receiving an input signal representing the desired frequency output of the fractional N synthesizer and for generating a digital output signal having M bits, which include N most significant bits and n least significant bits. The N most significant bits output by the accumulator are coupled to the multi-modulus divider and are operative for controlling the operation of the multi-modulus divider. The sigma delta interpolator further includes a delay circuit coupled to the accumulator, which functions to receive the n least significant bits and implement a delay function defined by equation: $1-(1-Z^{-1})^N$, where N corresponds to the order of the sigma delta interpolator.

18 Claims, 4 Drawing Sheets

FEED FORWARD SIGMA DELTA INTERPOLATOR FOR USE IN A FRACTIONAL-N SYNTHESIZER

RELATED APPLICATIONS

This application claims priority under 35 U.S.C. §119(e) to provisional application Ser. No. 60/235,685 filed Sep. 27, 2000.

FIELD OF THE INVENTION

The present invention relates to feed forward sigma delta interpolators and more particularly, to feed forward sigma delta interpolators for use in fractional N-type frequency synthesizers.

BACKGROUND OF THE INVENTION

The use of sigma delta interpolators in frequency synthesizers is well known in the art. In particular, sigma delta interpolators have been utilized in fractional N-type synthesizers. A typical prior art fractional N synthesizer is illustrated in FIG. 1. Referring to FIG. 1, the synthesizer comprises a reference frequency generator 10 (e.g. a crystal oscillator) for generating a reference frequency, Fo. The reference frequency generator 10 is coupled to a frequency divider circuit 12 so as to allow the frequency signal Fo to be divided down by a factor of R to a desired value. The output of the frequency divider 12 is then coupled to a phase-lock loop circuit 14 comprising a phase-detector 16, a filter 15, a voltage controlled oscillator 18 (VCO) and a variable divider circuit 20.

The synthesizer further includes a fractional control circuit comprising a sigma delta interpolator 21 coupled to the variable divider circuit 20. In operation, the sigma delta interpolator 21 controls the variable divider circuit 20 such that the divider alternately divides the VCO output 18 by a factor of N, or a factor of N+1. By controlling the rate by which the VCO output is divided by N or N+1, it is possible to generate an output signal, whose average value is a desired fraction of N. Typically, the sigma delta interpolator 21 comprises an accumulator having a predetermined/programmable modulo (i.e., capacity) and bit length, which is determined in accordance with the desired fractional output. In response to each pulse output by the variable divider circuit 20, the accumulator is incremented, and when the accumulator overflows, it generates a carry signal. The carry signal is coupled to the variable divider circuit 20 and utilized to determine whether or not the variable divider circuit 20 should divide by a factor of N or N+1. An example of the operation of the accumulator is illustrative. Assuming it is desired to generate a frequency output equal to (N+0.25) Fo/R, the accumulator is programmed so as to generate a carry bit every fourth pulse. As such, the variable divider circuit 20 will operate to divide by N for 3 pulses and divide by N+1 every fourth pulse. As a result, the output frequency of the synthesizer equals (N+0.25)Fo/R.

FIG. 2 illustrates an exemplary embodiment of a prior art first order sigma delta interpolator 21, utilized for example, in the fractional N synthesizer illustrated in FIG. 1. Referring to FIG. 2, the sigma delta interpolator 21 comprises an accumulator 25 and a delay element 26. As noted above, the accumulator 25 has one input for receiving an n-bit digital word, which corresponds to the desired output frequency of the fractional N synthesizer. The output of the accumulator 25 is coupled to the delay element 26, which forms a feedback loop with the accumulator 25. The accumulator 25 further comprises a carry over output signal 27, which is coupled to the variable divider circuit 20. The operation of the sigma delta interpolator 21 is as described above.

Higher order sigma delta interpolators have also been utilized in fractional N synthesizers. And while such higher order sigma delta interpolators have proven useful in suppressing the fractional spurs which are generated as a result of the implementation of the fractional N techniques, known higher order sigma delta interpolators have various problems associated with the use thereof.

For example, such known higher order sigma delta interpolators utilize multiple modulators and/or accumulators, as well as multiple feed back loops in the design. As a result, such higher order sigma delta interpolators are complex circuits, which require significant amounts of power during operation. In addition, known higher order sigma delta interpolators are both expensive to implement and expensive to operate. Furthermore, known higher order sigma delta interpolators are not especially well suited for high speed operation.

Accordingly, there exists the need for a higher order sigma delta interpolator for use in a fractional N synthesizer which eliminates the foregoing problems.

SUMMARY OF THE INVENTION

The present invention relates to a sigma delta interpolator for use in a fractional N synthesizer that reduces the complexity of the circuitry necessary to implement the interpolator and reduces the power consumption of the interpolator during operation relative to known interpolators. In addition, the higher order sigma delta interpolator of the present invention is especially suitable for high speed operation.

More specifically, the present invention relates to a sigma delta interpolator for use in a fractional N synthesizer having a multi-modulus divider for controlling the output frequency of the synthesizer. The sigma delta interpolator comprises an accumulator operative for receiving an input signal representing the desired frequency output of the fractional N synthesizer and for generating a digital output signal having M bits, which include N most significant bits and n least significant bits. The N most significant bits output by the accumulator are coupled to the multi-modulus divider and are operative for controlling the operation of the multi-modulus divider. The sigma delta interpolator further includes a delay circuit coupled to the accumulator, which functions to receive the n least significant bits and implement a delay function defined by the equation: $1-(1-Z^{-1})^N$, where N corresponds to the order of the sigma delta interpolator.

As described below, the sigma delta interpolator of the present invention provides important advantages over prior art devices. For example, by utilizing only MSB bits of a single accumulator, the circuitry necessary for implementing the interpolator is significantly reduced as compared to prior art designs, thus reducing the cost of the design. The sigma delta interpolator of the present invention can have a very large interpolator size without the need for complex hardware. As a result, very high resolution (i.e., sub HZ) can be achieved without compromising phase noise performance. Also the architecture of the present invention is very well suited for pipelining which allows the interpolator to operate at higher reference frequency.

Additional advantages of the present invention will become apparent to those skilled in the art from the following detailed description of exemplary embodiments of the present invention.

The invention itself, together with further objects and attendant advantages, will best be understood by reference to the following detailed description, taken in conjunction with the accompanying drawings.

DETAILED DESCRIPTION OF THE DRAWINGS

The following detailed description of the sigma delta interpolator of the present invention sets forth exemplary embodiments of the device. It is noted, however, that the present invention as claimed herein is not intended to be limited to the specific embodiments disclosed in the following discussion. Clearly other implementations of the novel sigma delta interpolator are possible.

Figure 2:
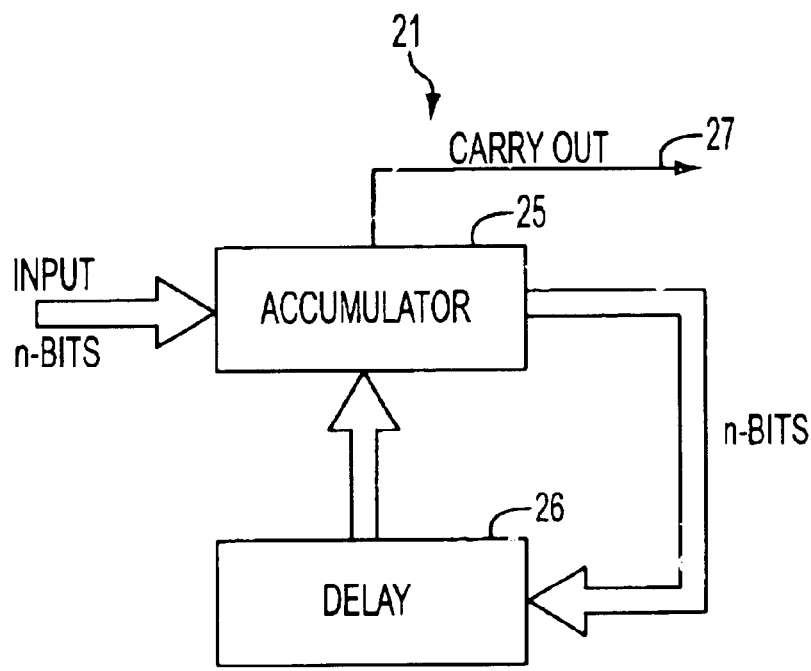
FIG. 2 is a block diagram of a prior art single order sigma delta interpolator.
Figure 3:
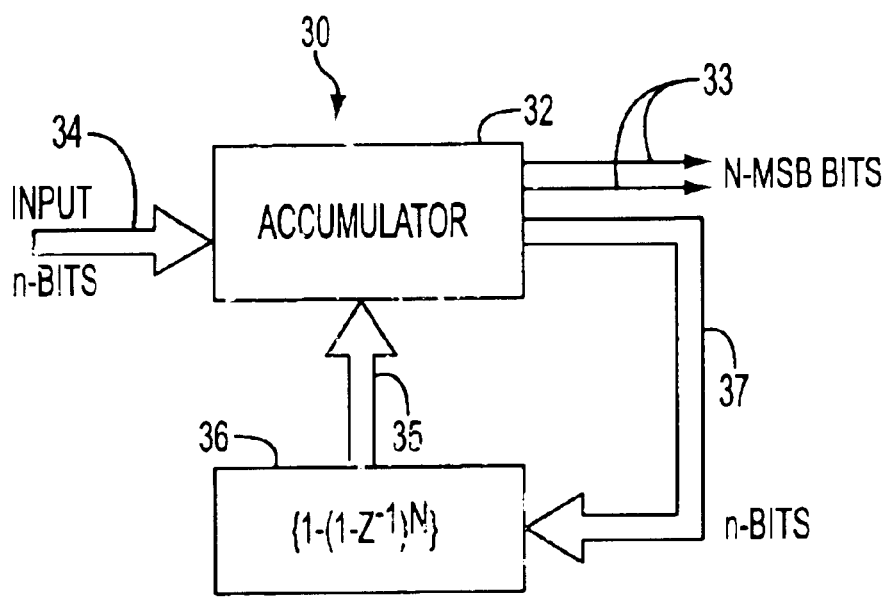
FIG. 3 is an exemplary block diagram of a $N^{th}$ order sigma delta interpolator in accordance with the present invention.

FIG. 3 illustrates a high-level block diagram of the sigma delta interpolator 30 of the present invention. Referring to FIG. 3, the sigma delta interpolator 30 of the present invention, which forms an unconditionally stable feed forward sigma delta interpolator, comprises an m-bit accumulator 32 having n-bit data bus 34 coupled to an input thereof so as to allow for the frequency control word to be input into the accumulator 32. The interpolator 30 further comprises delay circuitry 36 for implementing the delay function $\{1-(1-Z^{-1})^N\}$, where N equals the order of the sigma delta interpolator 30. As shown in FIG. 2, the output of the accumulator 32 is coupled to the input of the delay circuitry 36 via an n-bit data bus 37, and the output of the delay circuitry 36 is coupled to a second input of the accumulator 32 via data bus 35. The data bus 37 functions to couple the n least significant bits of the output of the accumulator 32 to the delay circuitry 36. It is noted that the size of the accumulator 32 is preferably equal to the size of the input frequency word (e.g., in the current example, n-bits) plus the order of the sigma delta interpolator (e.g., in the current example, N-bits). It is noted that in the current example the sigma delta interpolator accumulator size corresponds to a factor 2^28 or 28 bits, which is the fine tuning word size. It does not represent the size of the main adder.

Figure 1:
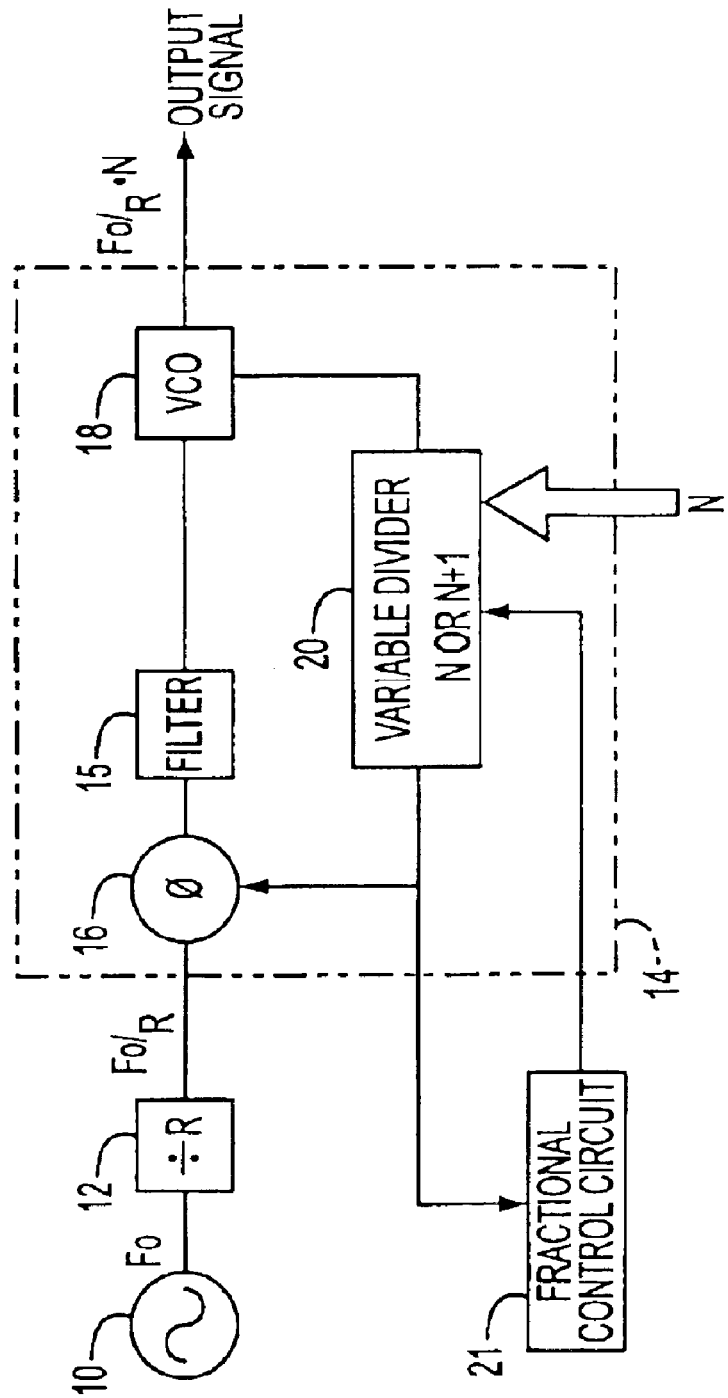
FIG. 1 is a block diagram of a prior art fractional N-type synthesizer.

It is noted that the output of the accumulator 32 further comprises a signal 33 formed by the N most significant bits (MSB), where N corresponds to the order of the sigma delta interpolator 32. The N-MSBs output by the accumulator 32 form the multi-modulus divider inputs. The multi-modulus divider (not shown in FIG. 2) forms part of the phase-lock loop "PLL" contained in an fractional N synthesizer as shown in FIG. 1.

It is further noted that when utilizing the foregoing interpolator 30 in a frequency synthesizer, the step size of the fractional N frequency synthesizer equals (Fref/R)((A/F), where Fref equals the reference frequency input into the accumulator 32, A equals the division ratio of a prescalar circuit contained in the above-mentioned PLL, and R is the division ratio of a reference divider (not shown) which forms part of the fractional N frequency synthesizer. Accordingly, as an example, utilizing an accumulator having a size of $F=2^{28}$ and a reference frequency of 10 MHz, step sizes of 0.037 Hz can be obtained.

Figure 4:
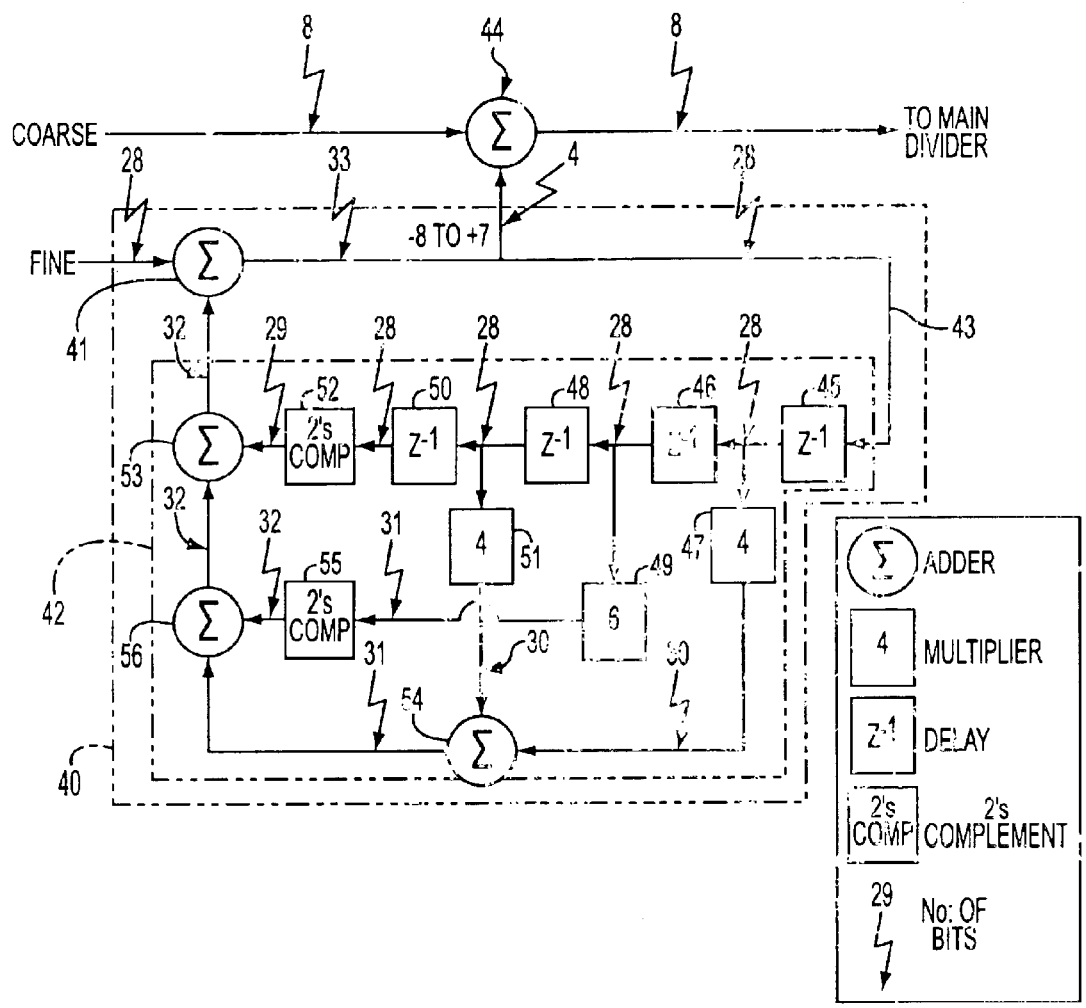
FIG. 4 is a block diagram illustrating an exemplary implementation of a $4^{th}$ order sigma delta interpolator in accordance with the present invention.

FIG. 4 is a block diagram illustrating an exemplary implementation of a $4^{th}$ order sigma delta interpolator 40 in accordance with the present invention. Referring to FIG. 4, the interpolator 40 comprises an accumulator 41, which receives a 28 bit data word (which corresponds to the desired frequency value) as an input signal. In the given embodiment, the accumulator 41 is 32-bit accumulator (i.e., size of the accumulator equals the bit size of the frequency input (e.g., 28 bits) plus the order of the interpolator (e.g., $4^{th}$). The output of the accumulator 41 comprises a 33 bit signal. The 28 LSBs are coupled to the delay circuit 42 via bus 43, while the 5 MSBs are coupled to an adder 44, which forms part of the fractional N synthesizer. It is noted that 5 MSBs represent a mark/space ratio signal, which controls the operation of the multi-modulus divider contained in the PLL of the fractional N synthesizer such that the desired frequency signal is generated. In other words, the 5 MSBs allow for fine tuning of the desired output frequency of the fractional N synthesizer. It is further noted that the second input of adder 44 receives a coarse frequency signal, which is added to the signal output by the interpolator 40.

Turning to the delay circuit 42, this circuit functions in part to perform noise shaping. Specifically, the circuit functions to move the quantization noise to higher frequencies by canceling the close-in noise. As such, the circuit assists the loop filter remove the higher frequency noise. As shown in FIG. 4, the delay circuit 42 includes a first delay element 45, for delaying the 28 bit signal received from the accumulator 41 by one clock cycle. One example of the first delay element 45 is a 28 bit wide latch. Of course, other delay elements can be utilized. The output of the first delay element 45 is coupled to the input of a second delay element 46 and to the input of a first multiplier 47. It is noted that all of the delay elements contained in the delay circuit can be implemented in the same manner. The output of the second delay element 46 is coupled to the input of a third delay element 48 and to the input of a second multiplier 49. The output of the third delay element 48 is coupled to the input of a fourth delay element 50 and to the input of a third multiplier 51. The output of the fourth delay element 50 is coupled to an input of a first two's complement circuit 52. The output of the first two complement circuit 52, which is a 28 bit signal, is coupled to one input of a first adder 53.

Returning to the first multiplier 47, which receives the 28 bit delayed signal output by the first delay element 45 as an input, this multiplier 47 functions to multiply the 28 bit signal by a factor of four. Thus, in binary terms, the first multiplier 47 functions to shift the 28 bit signal two bits to the left. Accordingly, the output of the first multiplier 47 comprises a 30 bit signal. In addition, the output of the first multiplier 47 is coupled to one input of a second adder 54.

Returning to the second multiplier 49, which receives the 28 bit signal output by the second delay element 46 as an input, this multiplier 49 functions to multiply the 28 bit signal by a factor of six. Thus, in binary terms, the second multiplier 49 functions to shift the 28 bit signal three bits to the left. Accordingly, the output of the second multiplier 49 comprises a 31 bit signal. In addition, the output of the second multiplier 49 is coupled to the input of a second two's complement circuit 55. The output of the second two's complement circuit 55, which is a 31 bit signal, is coupled to one input of a third adder 56.

Returning to the third multiplier 51, which receives the 28 bit signal output by the third delay element 48 as an input, this multiplier 51 functions to multiply the 28 bit signal by a factor of four. Thus, in binary terms, the third multiplier 51 functions to shift the 28 bit signal two bits to the left. Accordingly, the output of the third multiplier 51 comprises a 30 bit signal. In addition, the output of the third multiplier 51 is coupled to the second input of the second adder 54. The output of the second adder 54 is coupled to the second input of the third adder 56.

Finally, the output of the third adder 56, which is a 32 bit signal, is coupled to the second input of the first adder 53. The output of the first adder 53, which is also a 32 bit signal, is coupled to the second input of the accumulator 41.

It is noted that the accumulator 41 and all of the delay elements contained in the delay circuit 42 are clocked utilizing the same reference clock, which is a high speed clock as compared to the clock governing operation of the PLL of a fractional N synthesizer utilizing the sigma delta interpolator 40 in the design. For example, with the 0.18u CMOS process, it is possible to clock the interpolator at 100MHz with pipelining architecture of the present invention.

As noted above, the operation of the exemplary sigma delta interpolator 40 illustrated in FIG. 4 is as follows. First, the MSBs of the output of the accumulator 41 is a series of numbers which tend to average to the frequency value of the signal input into the accumulator 41 over a given cycle of the clock utilized to control the PLL of the fractional N synthesizer. The LSBs of the signal output by the accumulator 41, which represent a phase error signal, are coupled to the delay circuit 42, which functions to provide noise shaping and spurious frequency reduction. It is again noted, that in accordance with the exemplary embodiment of the present invention, the number of MSBs corresponds to the order of the sigma delta interpolator 40 and the number of LSBs corresponds to the size of the accumulator minus the MSBs.

Figure 5:
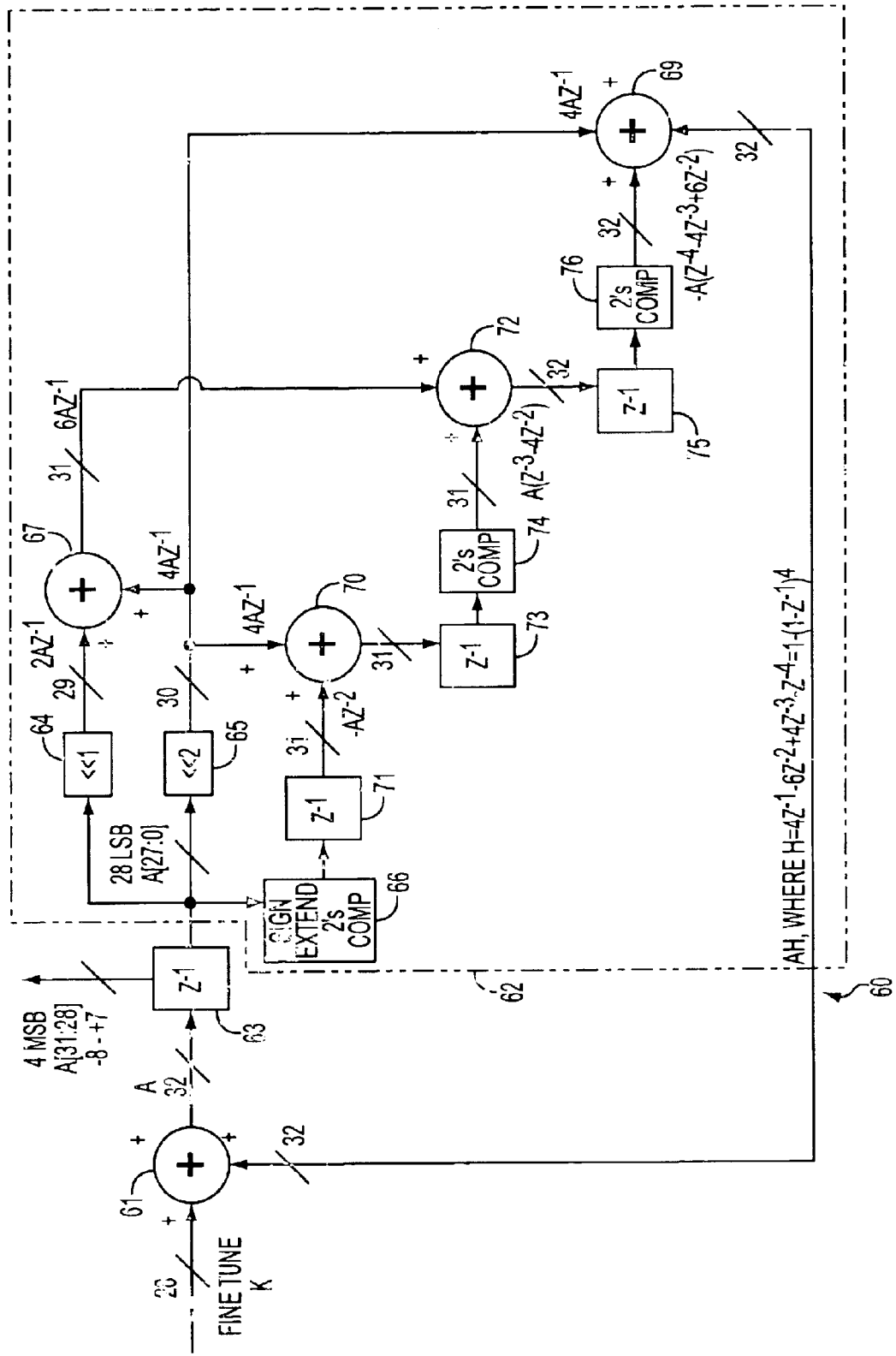
FIG. 5 is a block diagram illustrating an exemplary implementation of pipelined architecture of a $4^{th}$ order sigma delta interpolator in accordance with the present invention.

FIG. 5 is a block diagram illustrating an exemplary implementation of a pipelined architecture of a $4^{th}$ order sigma delta interpolator in accordance with the present invention. The pipelined implementation allows for increased operating speeds as compared to the implementation illustrated in FIG. 4 (e.g., approximately 5 times faster).

Referring to FIG. 5, similar to the embodiment of FIG. 4, the interpolator 60 comprises an accumulator 61, which receives a 28 bit data word (which corresponds to the desired frequency value) as an input signal. In the given embodiment, the accumulator 61 is 32-bit accumulator (i.e., size of the accumulator equals the bit size of the frequency input (e.g., 28 bits) plus the order of the sigma delta interpolator (e.g., $4^{th}$). The output of the accumulator 61 comprises a 32 bit signal, which is coupled to a first delay element 63. The first delay element 63 has two outputs. The first output comprises the 4 MSBs of the output of the accumulator 61, and represents the mark/space ratio signal, which controls the operation of the multi-modulus divider contained in the PLL of the fractional N synthesizer. The second output of the first delay element 63 comprises the 28 LSBs of the output of the accumulator 61, and is coupled to the delay circuit 62.

Turning to the delay circuit 62, the circuit includes a first multiplier 64, a second multiplier 65 and a sign extend two's complement circuit 66, each of which has an input coupled to the second output of the first delay element 63. The first multiplier 64, which receives the 28 bit delayed signal output by the first delay element 63 as an input signal, functions to multiply the signal by a factor of two. Accordingly, the output of the first multiplier 64 comprises a 29 bit signal, and assuming the LSBs output by the accumulator 61 are defined as "A", the output of the first multiplier equals $2AZ^{-1}$. In addition, the output of the first multiplier 64 is coupled to one input of a first adder 67. The second multiplier 65, which also receives the 28 bit delayed signal output by the first delay element 63 as an input signal, functions to multiply the signal by a factor of four. Accordingly, the output of the second multiplier 65 comprises a 30 bit signal, and equals $4AZ^{-1}$. In addition, the output of the second multiplier 65 is coupled to one input of the first adder 67, as well as one input of a second adder 69 and one input of a third adder 70. The sign extend two's complement circuit 66 functions to invert the signal received from the first delay element 63 and add an additional three bits to the signal. The output of the sign extend two's complement circuit 66 is coupled to an input of a second delay element 71. The output of the second delay element 71, which equals $-AZ^{-2}$, is coupled to one input of the third adder 70.

Continuing, the output of the first adder 67, which equals $6AZ^{-1}$, is coupled to one input of a fourth adder 72. The output of the third adder 70 is coupled to a second delay element 73 and a first two's complement circuit 74. The output of the first two's complement circuit 74, which equals $A(Z^{-3}-4Z^{-2})$, is coupled to a second input of the fourth adder 72. The output of the fourth adder 72 is coupled to a third delay element 75 and a second two's complement circuit 76. The output of the second two's complement circuit 76, which equals $-A(Z^{-4}-4Z^{-3}+6Z^{-2})$, is coupled to a second input of the second adder 69. The output of the second adder 69, which equals $-4A^{-1}-6Z^{-2}+4Z^{-3}-Z^{-4}$, is coupled back to the accumulator 61. It i function of the delay circuit $-4A^{-1}-6Z^{-2}+4Z^{-3}-Z^{-4}$ reduces to $1-(1-Z^{-1})^4$, which corresponds to the equation set forth above with regard to FIG. 2, as the sigma delta interpolator illustrated in FIG. 5 is a fourth order sigma delta interpolator. The operation of the sigma delta interpolator of FIG. 5 is essentially the same as the operation of the sigma delta interpolator illustrated in FIG. 4. It is again noted that the present invention is not intended to be limited to the specific embodiments of the delay circuits disclosed herein. Clearly other implementations are possible.

As described above, the sigma delta interpolator of the present invention provides important advantages over prior art devices. Most importantly, by utilizing only a single accumulator, the circuitry necessary for implementing the sigma delta interpolator is significantly reduced as compared to prior art designs, thus reducing the cost of implementing the design. In addition, utilization of only a single accumulator results in a significant reduction in the power requirements for operating the sigma delta interpolator. Moreover, the use of the single accumulator allows for the interpolator to operate at higher frequencies.

Furthermore, when the sigma delta interpolator is utilized in a fractional N synthesizer, fine resolution can be obtained without sacrificing the spurious performance of the synthesizer. As such, the present invention eliminates the need for an expensive direct digital synthesizer to be included in the synthesizer design.

It is further noted that the present invention supports both external dual modulus (P/P+1) prescalar and external multi-modulus high frequency prescalar.

Of course, it should be understood that a wide range of other changes and modifications can be made to the preferred embodiment described above. It is therefore intended that the foregoing detailed description be regarded as illustrative rather than limiting and that it be understood that it is the following claims including all equivalents, which are intended to define the scope of the invention.

What is claimed is:

1. A sigma delta interpolator for use in a fractional N synthesizer having a multi-modulus divider, said sigma delta interpolator comprising:

an accumulator operative for receiving an input signal representing a desired frequency output of said fractional N synthesizer and for generating a digital output signal having M bits, which include N most significant bits and n least significant bits, said N most significant bits being coupled to said multi-modulus divider and operative for controlling the operation of said multi-modulus divider; and a delay circuit coupled to said accumulator, said delay circuit receiving said n least significant bits and operative for implementing a delay function defined by equation: $1-(1-Z^{-1})^N$, wherein N corresponds to the order of the sigma delta interpolator, and N is greater than or equal to 2.

2. The sigma delta interpolator for use in a fractional N synthesizer having a multi-modulus divider according to claim 1, wherein said sigma delta interpolator is a fourth order sigma delta interpolator.

3. The sigma delta interpolator for use in a fractional N synthesizer having a multi-modulus divider according to claim 2, wherein said digital output signal of said accumulator comprises a 32 bit word, with the 4 most significant bits of said 32 bit word being coupled to said multi-modulus divider and the 28 least significant bits of said 32 bit word being coupled to the said delay circuit.

4. The sigma delta interpolator for use in a fractional N synthesizer having a multi-modulus divider according to claim 1, wherein said N most significant bits output by said accumulator correspond to said desired frequency output of said fractional N synthesizer.

5. The sigma delta interpolator for use in a fractional N synthesizer having a multi-modulus divider according to claim 4, wherein said accumulator is the sole accumulator utilized in said sigma delta interpolator.

6. The sigma delta for use in a fractional N synthesizer having a multi-modulus divider according to claim 4, wherein said N most significant bits output by said accumulator and coupled to said multi-modulus divider are the sole control signals received by said multi-modulus divider the effect the desired output frequency generated by said fractional N synthesizer.

7. A sigma delta interpolator for use in a fractional N synthesizer having a multi-modulus divider, said sigma delta interpolator comprising:

an accumulator operative for receiving an input signal representing a desired frequency output of said fractional N synthesizer and for generating a digital output signal having M bits, which include N most significant bits and n least significant bits, said N most significant bits being coupled to said multi-modulus divider and operative for controlling the operation of said multi-modulus divider; and a delay means coupled to said accumulator, said delay means receiving said n least significant bits and operative for implementing a delay function defined by equation: $1-(1-Z^{-1})^N$, wherein N corresponds to the order of the sigma delta interpolator, and N is greater than or equal to 2.

8. The sigma delta interpolator for use in a fractional N synthesizer having a multi-modulus divider according to claim 7, wherein said sigma delta interpolator is a fourth order sigma delta interpolator.

9. The sigma delta interpolator for use in a fractional N synthesizer having a multi-modulus divider according to claim 8, wherein said digital output signal of said accumulator comprises a 32 bit word, with the 4 most significant bits of said 32 bit word being coupled to said multi-modulus divider and the 28 least significant bits of said 32 bit word being coupled to the said delay means.

10. The sigma delta interpolator for use in a fractional N synthesizer having a multi-modulus divider according to claim 7, wherein said N most significant bits output by said accumulator correspond to said desired frequency output of said fractional N synthesizer.

11. The sigma delta interpolator for use in a fractional N synthesizer having a multi-modulus divider according to claim 10, wherein said accumulator is the sole accumulator utilized in said sigma delta interpolator.

12. The sigma delta for use in a fractional N synthesizer having a multi-modulus divider according to claim 10, wherein said N most significant bits output by said accumulator and coupled to said multi-modulus divider are the sole control signals received by said multi-modulus divider the effect the desired output frequency generated by said fractional N synthesizer.

13. A fractional N frequency synthesizer comprising:

a sigma-delta interpolator including an accumulator operative for receiving an input signal representing a desired frequency output of said fractional N synthesizer and for generating a digital output signal having M bits, which include N most significant bits and n least significant bits, and a delay circuit coupled to said accumulator, said delay means receiving said n least significant bits and operative for implementing a delay function defined by equation: $1-(1-Z^{-1})^N$, and a phase-lock loop circuit comprising a voltage controlled oscillator for generating a carrier signal and a programmable frequency divider, said programmable frequency divider receiving said N most significant bits as an input signal, said programmable frequency divider operative for changing the frequency of the carrier signal in accordance with said N most significant bits, wherein N corresponds to the order of the sigma delta interpolator, and N is greater than or equal to 2.

14. The fractional N synthesizer according to claim 13, wherein said sigma delta interpolator is a fourth order sigma delta interpolator.

15. The fractional N synthesizer according to claim 14, wherein said digital output signal of said accumulator comprises a 32 bit word, with the 4 most significant bits of said 32 bit word being coupled to said multi-modulus divider and the 28 least significant bits of said 32 bit word being coupled to the said delay means.

16. The fractional N synthesizer according to claim 13, wherein said N most significant bits output by said accumulator correspond to said desired frequency output of said fractional N synthesizer.

17. The fractional N synthesizer according to claim 16, wherein said accumulator is the sole accumulator utilized in said sigma delta interpolator.

18. The fractional N synthesizer according to claim 16, wherein said N most significant bits output by said accumulator and coupled to said programmable frequency divider are the sole control signals received by said programmable frequency divider that effect the desired output frequency generated by said fractional N synthesizer.

* * * * *